United States Patent [19]
Jeong

[11] Patent Number: 5,949,735
[45] Date of Patent: Sep. 7, 1999

[54] ROW DECODER FOR SEMICONDUCTOR MEMORY DEVICE

[75] Inventor: Jae-Hong Jeong, Seoul, Rep. of Korea

[73] Assignee: LG Semicon Co., Ltd., Cheong-ju, Rep. of Korea

[21] Appl. No.: 08/956,361

[22] Filed: Oct. 23, 1997

[30] Foreign Application Priority Data

Oct. 30, 1996 [KR] Rep. of Korea ............. 96-49917

[51] Int. Cl.$^6$ .............................................. G11C 8/00
[52] U.S. Cl. ............................ 365/230.06; 365/230.08; 365/203
[58] Field of Search ............................ 365/230.06, 203, 365/230.08; 326/105, 106

[56] References Cited

U.S. PATENT DOCUMENTS

| | | | |
|---|---|---|---|
| 5,351,217 | 9/1994 | Jeon | 365/230.06 |
| 5,412,331 | 5/1995 | Jun et al. | 326/105 |
| 5,615,164 | 3/1997 | Kirihata et al. | 365/230.06 |

*Primary Examiner*—Huan Hoang

[57] ABSTRACT

The row decoder includes an internal node and an output node. A decoding unit receives a plurality of externally-applied address signals and pulls down the internal node to a logic low voltage when the plurality of address signals have an active state. A latch unit pulls up the output node to a logic high voltage in response to the pulling-down of the internal node by the decoding unit, pulls down the output node to the logic low voltage when the internal node is at the logic high voltage, and reduces a voltage at the internal node to a voltage less than the logic high voltage and greater than the logic low voltage based on a selection signal.

15 Claims, 5 Drawing Sheets

ROW DECODER FOR SEMICONDUCTOR MEMORY DEVICE

BACKGROUND OF THE INVENTION

1. Field of the Invention

The present invention relates to a row decoder for a semiconductor memory device, and in particular to a row decoder for a semiconductor memory device which is capable of driving a word line driving unit and a word line of a semiconductor memory in accordance with a pre-decoded row address signal.

2. Description of the Conventional Art

Figure 1:
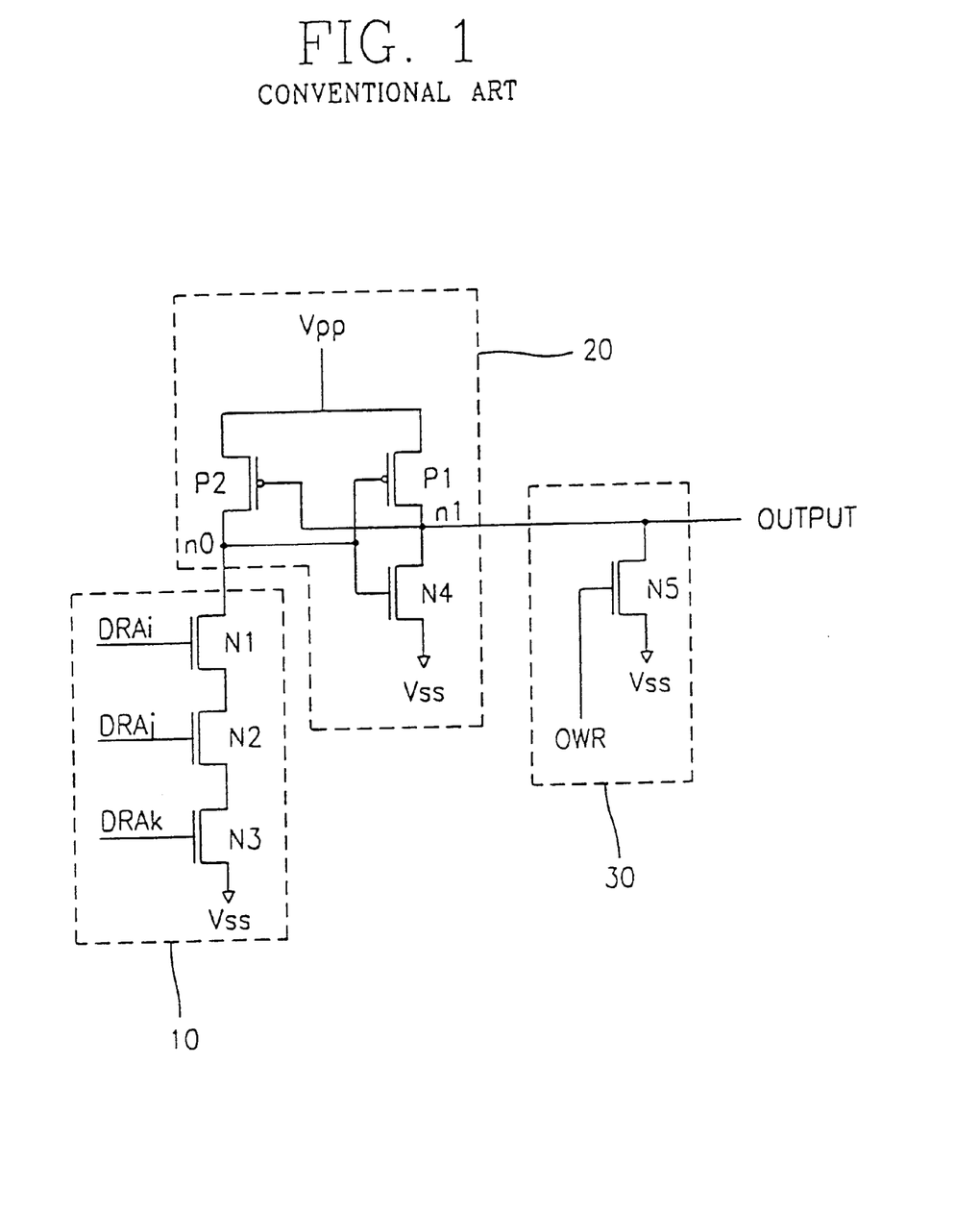
FIG. 1 is a circuit diagram illustrating a conventional row decoder for a semiconductor memory device.

As shown in FIG. 1, a conventional row decoder for a semiconductor memory device includes a decoding unit 10 which has a NAND-gate constituted by NMOS transistors N1, N2 and N3 connected in series with a ground voltage Vss. The NMOS transistors N1, N2 and N3 respectively receive at their gates row address signals DRAi, DRAj and DRAk, pre-decoded by an externally connected pre-decoding unit (not shown), for NANDing the row address signals to thereby decode the same. The row decoder also includes a latch unit 20, which is composed of (1) a PMOS transistor P1 and an NMOS transistor N4 connected in series between a boosted power supply voltage Vpp and the ground voltage Vss to constitute a CMOS inverter for inverting an output signal from the decoding unit 10, and (2) a PMOS transistor P2, the gate of which receives an output signal from the inverter, the source of which receives the power supply voltage Vpp, and the drain of which is connected, at a node n0, with an output terminal of the decoding unit 10. The PMOS transistor 12 performs a pull-up function. The row decoder also includes a reset unit 30 composed of an NMOS transistor N5, the drain of which is connected with an output terminal of the latch unit 20, the source of which receives the ground voltage Vss, and the gate of which receives a word line reset signal OWR. The reset unit 30 is for resetting an output signal from the row decoder.

The output terminal of the conventional row decoder is connected with a word line driver (not shown) for driving an associated word line WL of a memory.

The above-described row decoder is disclosed in U.S. Pat. No. 5,412,331. The operation thereof will now be explained.

First, in a state that the word line is not selected, the NMOS transistor N5 is turned on by a high level word line reset signal OWR, and the voltage at a connection node n1, connected with the latch unit 20 and the reset unit 30, is pulled-down to a low level of the ground voltage Vss, whereby an output signal of the row decoder supplied to a corresponding word line driver (not shown) maintains a low level reset state.

In addition, the pull-up PMOS transistor P2 of the latch unit 20, the gate of which receives the low level signal from the node n1, is turned on, and the voltage at the node n0 connected between the drain terminal of the PMOS transistor P2 and the output terminal of the decoding unit 10 becomes a high level, so that the NMOS transistor N4 of the latch unit 20 is turned on, whereby the output signal from the row decoder maintains a low level.

When the word line is selected, the word line reset signal OWR becomes a low level, and the NMOS transistor N5 of the reset unit 30, the gate of which receives the low level word line reset signal OWR, is thereby turned off. When the pre-decoded address signals DRAi, DRAj, and DRAk all become high, the NMOS transistors N1 through N3 are turned on to connect the node 0 to the ground voltage Vss so that the voltage on the node 0 is discharged and assumes the low level ground voltage Vss. Accordingly, the low level voltage is applied to the respective gates of the PMOS transistor P1 and the NMOS transistor N4 of the latch unit 20, which together operate as in inverter.

Thereafter, as the PMOS transistor P1 of the inverter is turned on, the output signal from the row decoder assumes a pulled-up state of a high level of the power voltage Vpp, and an external word line driver (not shown) is driven by the output signal from the row decoder, and the word line WL (not shown) connected with the external word line driver is activated so that data is read from or written to a memory cell (not shown).

At this time, the pull-up PMOS transistor P2 the gate of which receives the high level output signal from the latch unit 20 is turned off, and the node n0 signal, which supplies an input signal to the CMOS inverter composed of transistors P1 and N4, is influenced only by the pulled-down output voltage through the NMOS transistors N2, N3, and N4, which perform a NANDing operation of the pre-decoded address signals.

However, in the conventional row decoder, since the voltage level of the externally boosted voltage Vpp applied through the pull-up PMOS transistor P2 is higher than that of the pre-decoded row address signals DRAi, DRAj and DRAk which are inputted to the respective gates of the NMOS transistors N1, N2 and N3 of the decoding unit 10, when a word line is selected, the voltage at the node n0 connected with the decoding unit 10 and the latch unit 20 slowly transitions from a high level to a low level, the amount of current flowing through the NMOS transistors N1, N2, and N3 of the decoding unit 10 is increased, and the power consumption is thereby increased. In order to overcome the above-described problems, the NMOS transistors N1, N2 and N3 are made large so that the NMOS transistors N1, N2 and N3 of the decoding unit 10, which operates as a pull-down NAND-gate, operate more powerfully than the PMOS transistor P2 of the latch unit 20. But, in consequence the layout area of the semiconductor memory device is disadvantageously increased.

SUMMARY OF THE INVENTION

Accordingly, it is an object of the present invention to provide a row decoder for a semiconductor memory device which overcomes the aforementioned problems encountered in the conventional art.

It is another object of the present invention to provide an improved row decoder for a semiconductor memory device which is capable of reducing power consumption by reducing current consumption when a row decoder selected by an externally applied address is operated, and of decreasing the data access time of is a semiconductor memory by increasing a transition speed of a voltage level.

To achieve the above objects, there is provided a row decoder for a semiconductor memory apparatus which includes a decoder for pulling-down the internal node to a ground voltage level when all of the plurality of address signals have an active state, a reset latch unit for pulling-up the output node to approximately the level of a boosted power supply voltage in response to pulling-down of the internal node to ground voltage level by the decoder, for pulling-down the output node to the ground voltage level when the internal node is at approximately the level of the boosted power supply voltage, and for pulling-up the internal node to approximately the level of the boosted power supply voltage in response to a pulled-down state of the output node and an externally applied selection signal, and a precharge unit for pulling-up the internal node to approximately the level of the boosted power supply voltage in response to an externally applied precharge signal.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 2:
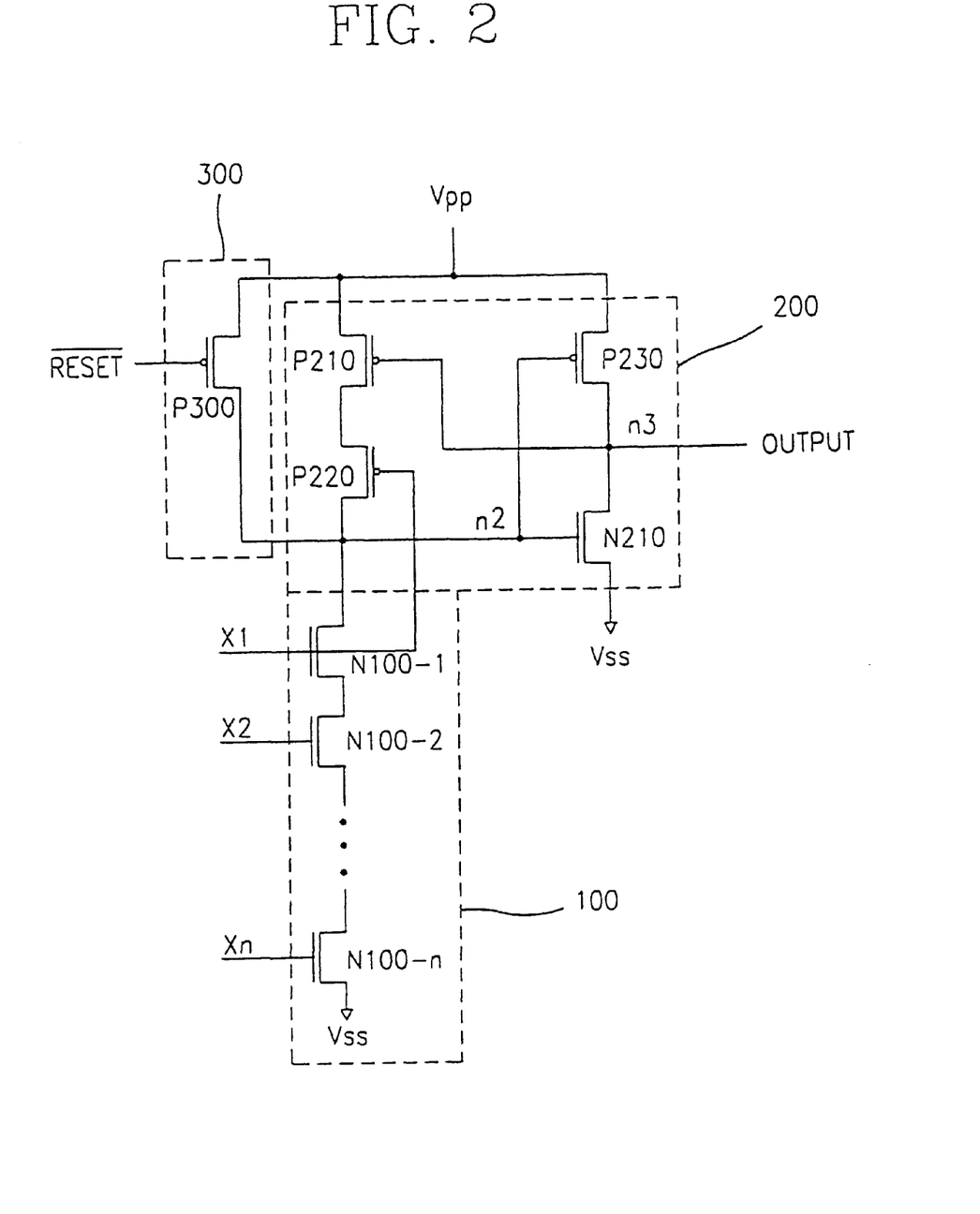
FIG. 2 is a circuit diagram illustrating a row decoder for a semiconductor memory device according to a first embodiment of the present invention.

As shown in FIG. 2, the row decoder for a semiconductor memory device according to a first embodiment of the present invention includes a decoding unit 100 for decoding row address signals X1~Xn pre-decoded by an externally connected pre-decoding unit (not shown), a reset latch unit 200 for decreasing a pull-up capability by an externally applied voltage Vpp, enabling a high speed setting of the state of an output voltage when the word line is selected by an output voltage from the decoding unit 100, and maintaining a reset state of the output voltage when the word line is not selected, and a pre-charge unit 300 for enabling a high speed transition of an output voltage from the reset latch unit 200 in accordance with a reset signal RESET or an inverted reset signal /RESET from an externally connected pre-decoding unit (not shown).

The decoding unit 100 includes a plurality of NMOS transistors N100-1 through N100-n which decode pre-decoded address signals X1~Xn and output the decoded result to the reset latch unit 200. The NMOS transistors N100-1 through N100-n are connected in series between a node n2 and ground voltage Vss, and their gates respectively receive pre-decoded row address signals x1 through Xn from the externally connected pre-decoding unit (not shown).

The reset latch unit 200 includes a first PMOS transistor P210 a second PMOS transistor P220. The first PMOS transistor P210 performs a pull-up function, the source of which receives the boosted supply voltage Vpp, and the gate of which receives the output signal from a node n3 of the reset latch unit 200. With the second PMOS transistor P220, the source is connected with the drain of the first PMOS transistor P210, the drain is connected with the node n2, which is connected with the output terminal of the decoding unit 100 and an output terminal of the pre-charge unit 300, respectively, and the gate receives the pre-decoded address signal x1 from the externally connected pre-decoding decoding unit to control a pull-up operation of the first PMOS transistor P210 during a latch state conversion (for example, a mode conversion for selecting a word line). The reset latch unit 200 further includes a third PMOS transistor P230 and an NMOS transistor N210 connected in series between the boosted supply voltage Vpp and ground voltage Vss, which together operate as an inverter for inverting the state of the node n2 and which determine the output of the row decoder.

Here, the node n3, connected with the drains of the third PMOS transistor P230 and the NMOS transistor N210, serves as the output terminal of the row decoder, and is connected with a word line driver (not shown) which drives an externally connected word line WL.

The pre-charge unit 300 includes a PMOS transistor P300, the drain of which is commonly connected with the node n2 and with the decoding unit 100, the source of which receives the boosted supply voltage Vpp, and the gate of which receives an inverted reset signal /RESET (active low) from the externally connected pre-decoding unit. Here, the PMOS transistor P300 is provided for pulling-up the node n2 to the supply voltage Vpp in accordance with an active low state of the inverted reset signal /RESET and maintaining a low state of the output signal from the reset latch unit 200 when a word line is not selected.

The operation of the row decoder for a semiconductor memory device according to the first embodiment of the present invention will now be explained.

First, when (1) the decoding unit 100 outputs no signal in accordance with inactive low states of all of row address signals X1 through Xn pre-decoded by the externally connected pre-decoding unit (not shown) in the mode that a word line is not selected and (2) the PMOS transistor P300 of the pre-charge unit 300 outputs a high level signal in accordance with an active low state of the inverted reset signal /RESET from the pre-decoding unit (not shown), the connection node n2 is charged to a high level through a pull-up operation and the output from the inverter becomes a low level (reset state) by the turning on of NMOS transistor N210 to generate an output from the row decoder of Vss.

The low level of Vss on the output node n3 is also applied to the gate of the PMOS transistor P210, which is turned on thereby. The low level pre-decoded address signal x1 is also applied to the gate of the PMOS transistor P220 which is turned on thereby. In this way, the turned on PMOS transistors P210 and P220 in series pull-up the node n2 and thereby cause the NMOS transistor N210 to be maintained in the ON state for latching the output node n3 at a low level state even after the inverted reset signal /RESET transitions to an inactive high level.

The word line driver (not shown) maintains a low level state in accordance with the low level signal from the row decoder. Here, the operational state that the word line is selected or not selected is determined based on the row address signals X1 through Xn, pre-decoded by the externally connected pre-decoding unit (notshown). When the pre-decoded row address signals X1 through Xn are an operation is performed for selecting the corresponding word line.

Then, in the mode that the word line is selected, an inactive high level of the inverted high level reset signal /RESET causes the PMOS transistor P300 to be turned off, and during this operation, the row decoder maintains a low state output by the reset latch unit 200, because the node n2 remains fully pulled-up.

At this time, when the pre-decoded row address signals X1 through Xn from the externally connected pre-decoding unit (not shown) are all high levels, the PMOS transistor P220 is only slightly turned on by the high level of the pre-decoded row address signal x1 applied to its gate, and the series NMOS transistors N100-1 through N100-3 are all turned on so that the node n2 is discharged to a low level through a pull-down of the decoding unit 100. Thereby, the output from the reset latch unit 200 transitions to a high level, whereby the word line WL is activated by the externally connected word line driver (not shown).

In addition, at the initial stage of the transition, since the first PMOS transistor 210 of the reset latch unit 200 receives through its gate a voltage having a level approximately that of the level of the ground voltage Vss through the NMOS transistor N210, the first PMOS transistor 210 is fully turned on, and the second PMOS transistor P220 the gate of which receives the pre-decoded row address signal X1, having a voltage level lower than the boosted supply voltage Vpp, is only slightly turned on.

However, since the turn-on resistance of the second PMOS transistor P220 is very high, the second PMOS transistor P220 regulates the output from the first PMOS transistor 210, and the pull-down operation of the node n2 through the NMOS transistors N100-1 through N100-n of the decoding unit 100 is more easily performed than the pull-up operation by the first PMOS transistor P210.

When the output from the row decoder fully transitions to a high level (set state), the first PMOS transistor P210 of the reset latch unit 200 is fully turned off, and the node n2 fully becomes discharged to a low level.

In addition, when (1) the mode is changed from a mode in which the word line is not selected to a mode in which the word line is selected, even though the inverted reset signal /RESET applied to the gate of the PMOS transistor P300 of the pre-charge unit 300 is an inactive high level, (2) the pre-decoded address signals X1 through Xn inputted into the decoding unit 100 are not all high, and (3) only the address signal X1 is a high level, the second PMOS transistor P220 is slightly turned on as the voltage applied to its gate is lower than the boosted supply voltage Vpp applied to its source and the reset latch unit 200 continuously maintains a low level latch loop, whereby the word line maintains a stable state.

As described above, in the mode that a word line is not selected, the PMOS transistor P300 of the pre-charge unit 300 enhances a voltage level pull-up operation of the connection node n2, and the output from the row decoder is rapidly transited to a low level, whereby the externally connected word line driver (not shown) and the word line (WL) maintain a stable low state. In the mode that the word line is selected, the second PMOS transistor P220 of the reset latch unit 200 controls the pull-up capability of the first PMOS transistor P210, thus easily enabling a pull-down operation of the node n2.

The amount of current flowing through the first and second PMOS transistors P210 and P220 and through the NMOS transistors N100-1 through N100-n of the decoding unit 100 is decreased, and the transition speed of the row decoder is increased. In addition, it is possible to reduce the sizes of the NMOS transistors N100-1 through N100-n, thus reducing the area of a layout of the row decoder.

Figure 3:
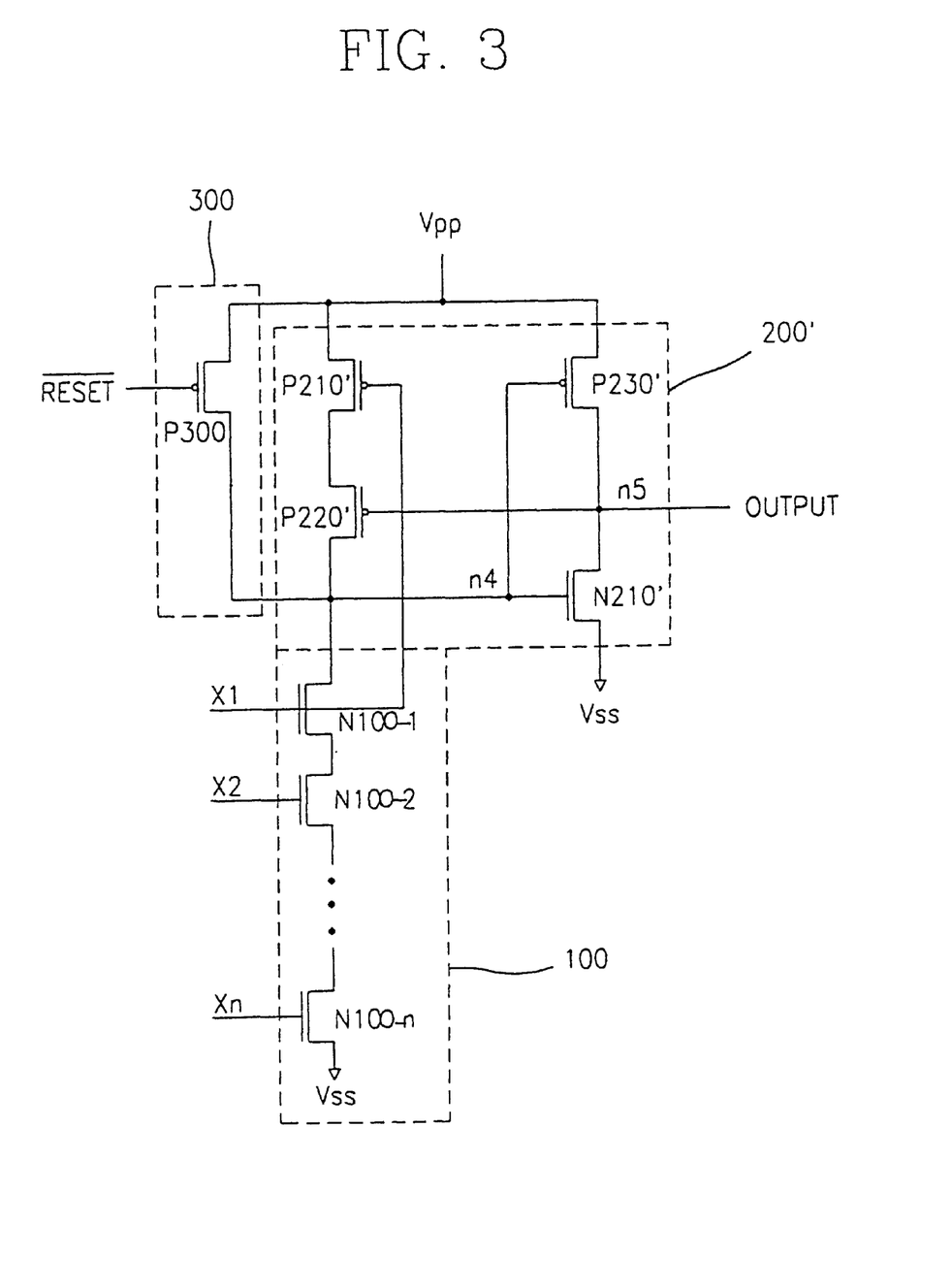
FIG. 3 is a circuit diagram illustrating a row decoder for a semiconductor memory device according to a second embodiment of the present invention.

As shown in FIG. 3, in the row decoder according to a second embodiment of the present invention, the decoding unit 100 and the pre-charge unit 300 are configured identically to the first embodiment in FIG. 2. The reset latch unit 200' is configured so that the pre-decoded row address signal X1 from an externally connected pre-decoding unit (not shown) is applied to the gate of the first PMOS transistor P210', and the output signal of the row decoder is applied to the gate of the second PMOS transistor P220', whereby the first PMOS transistor P210' directly regulates the supply voltage Vpp in the mode that a word line of the row decoder is selected. In addition, the third PMOS transistor P230' and the NMOS transistor N210', which determine the output from the reset latch unit 200 and operate as an inverter, are configured identically to the first embodiment in FIG. 2.

The operation of the row decoder according to the second embodiment of the present invention will now be explained with reference to FIG. 3.

In the mode that the word line is not selected, identically to the first embodiment of the present invention, the externally connected word line driver (not shown) maintains a low state of the word line WL in accordance with an output from the row decoder based on an active low level of the inverted low level reset signal /RESET which is externally inputted.

In the row decoder according to the second embodiment of the present invention, an inactive high level of the inverted reset signal /RESET causes the PMOS transistor P300 of the pre-charge unit 300 to be turned off. During the above-described operation, the row decoder maintains a low level state due to the action of the reset latch unit 200'.

The low level of the pre-decoded row address signal x1 is applied to the gate of the PMOS transistor P210' which is turned on thereby, and the pre-charging of the node n4 through the turned on PMOS pull-up transistor P300 causes the PMOS transistor P230' to be turned off and the NMOS transistor N210' to be turned on, so that the node N5 is pulled down to ground level Vss. This in turn causes the PMOS pull-up transistor P220' to turn on, and thereby the node n4 is continuously pulled up through the series-connected PMOS transistors P210', P220' to latch the inverted output state of the node n5 low even after the transition of the inverted reset signal /RESET to the inactive high state.

At this time, when the pre-decoded row address signals X1 through Xn from the externally connected pre-decoding unit (not shown) become all high level, the voltage on the connection node n4 discharges to the low ground level by the pull-down operation of the decoding unit 100, and the output signal from the reset latch unit 200' is changed to a high level by the pull-up operation of the transistor P230'. The word line WL is activated by the word line driver (not shown).

During the transition period, the first PMOS transistor P210' of the reset latch unit 200' is only slightly turned on as the pre-decoded address signal x1 having a level lower than the boosted supply voltage Vpp level is applied to its gate, and the second PMOS transistor 220' is turned on as a voltage having a level approximating the level of the ground voltage Vss is applied to its gate.

However, since the first PMOS transistor P210' has a high turn-on resistance, the boosted supply voltage Vpp is directly regulated, whereby the pulling-up operation of the second PMOS transistor P220' is controlled. Therefore, the pulling-down of the connection node n4 through the series NMOS transistors N100-1 through N100-n of the decoding unit 100 is more easily performed rather than the pulling-up operation by the second PMOS transistor P220'.

When (1) the mode is changed from a mode in which the word line is not selected to a mode in which the word line is selected, even when the inverted reset signal /RESET, which is applied to the gate of the PMOS transistor P300 of the pre-charge unit 300, is an inactive high level, (2) the pre-decoded address signals X1 through Xn, which are inputted into the decoding unit 100, are not all high level, and (3) only the address signal X1, which is applied to the gate of the first PMOS transistor P210', is a high level, the voltage level which is applied to the gate of the first PMOS transistor P210' is lower than the boosted supply voltage which is applied to the source thereof. Therefore, since the first PMOS transistor P210' is slightly turned on, the reset latch unit 200' maintains a low level latch loop state, and the word line maintains a stable low level state.

The operation and effects of the row decoder according to the second embodiment of the present invention are the same as in the first embodiment of the present invention. Therefore, description thereof will be omitted.

Figure 4:
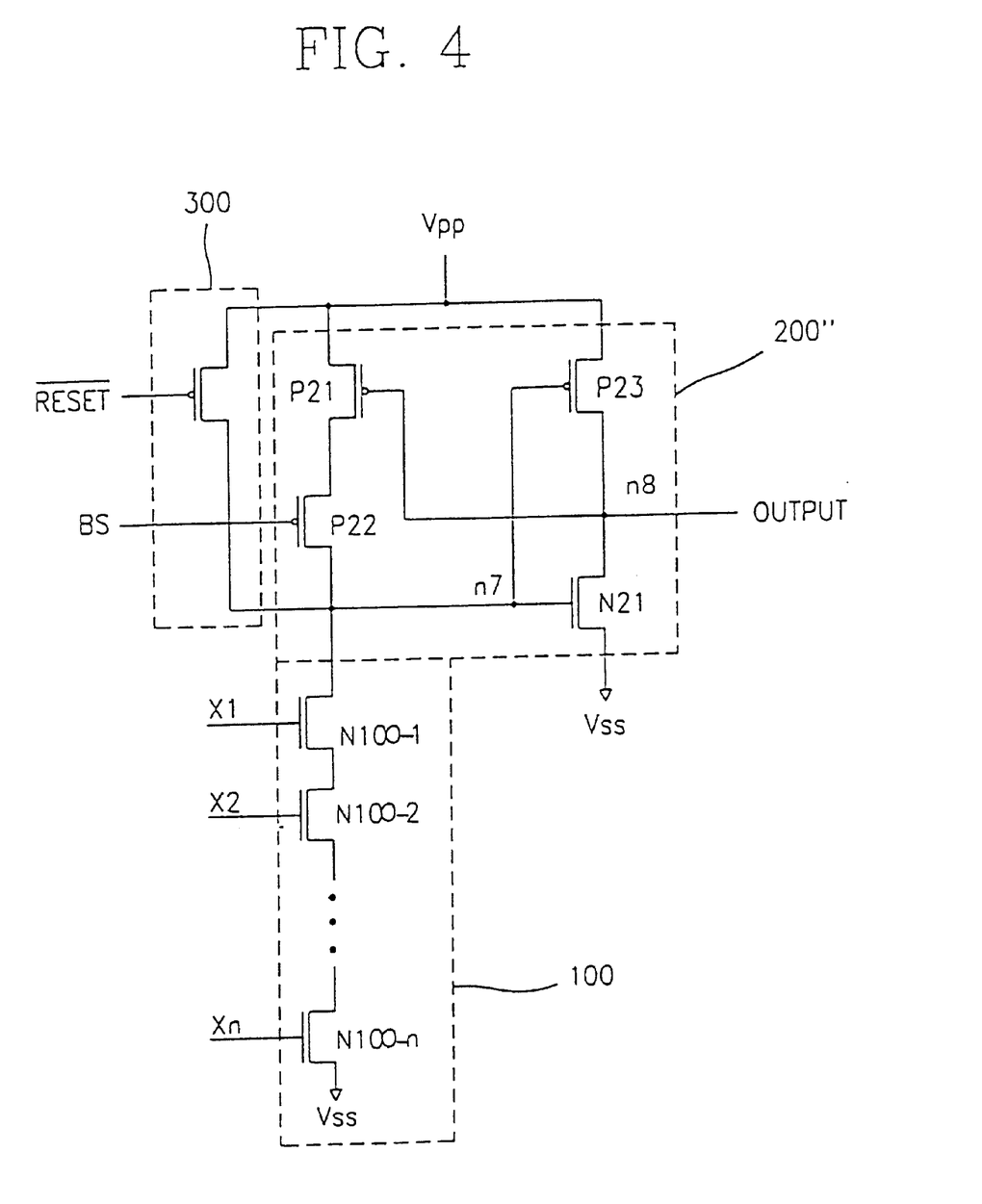
FIG. 4 is a circuit diagram illustrating a row decoder for a semiconductor memory device according to a third embodiment of the present invention.

In a row decoder according to a third embodiment of the present invention, as shown in FIG. 4, the decoding unit 100 and the pre-charge unit 300 are configured identically to those in the first embodiment in FIG. 2. In the reset latch unit 200", the output signal developed at the output node n8 of the row decoder is applied to the gate of the first PMOS transistor P210", and the gate of the second PMOS transistor P220" receives an active low level block selection signal BS which is pre-decoded by the externally connected pre-decoding unit (not shown), whereby the pull-up operation of the first PMOS transistor P210" is controlled. In addition, the third PMOS transistor P230" and the NMOS transistor N210" which operate as an inverter to determine the output level of the reset latch unit 200" are connected identically as in the first embodiment in FIG. 2.

The operation of the row decoder according to the third embodiment of the present invention will now be explained. In the mode that the word line is selected, a low level block selection signal BS is applied to the gate of the second PMOS transistor P220" of the reset latch unit 200", and thus the pull-up operation of the first PMOS transistor P210 and the second PMOS transistor P220" is controlled identically to the reset latch unit 200 of the row decoder according to the first embodiment of the present invention. Therefore, the pulling-down of the connection node n7 is more easily performed by the decoding unit 100.

The operation and effects of the row decoder according to the third embodiment of the present invention are the same as in the row decoder according to the first embodiment, and thus descriptions thereof will be omitted. In the row decoder according to the third embodiment of the present invention, it is possible to reduce the capacitive loading of the pre-decoded row address signals.

Figure 5:
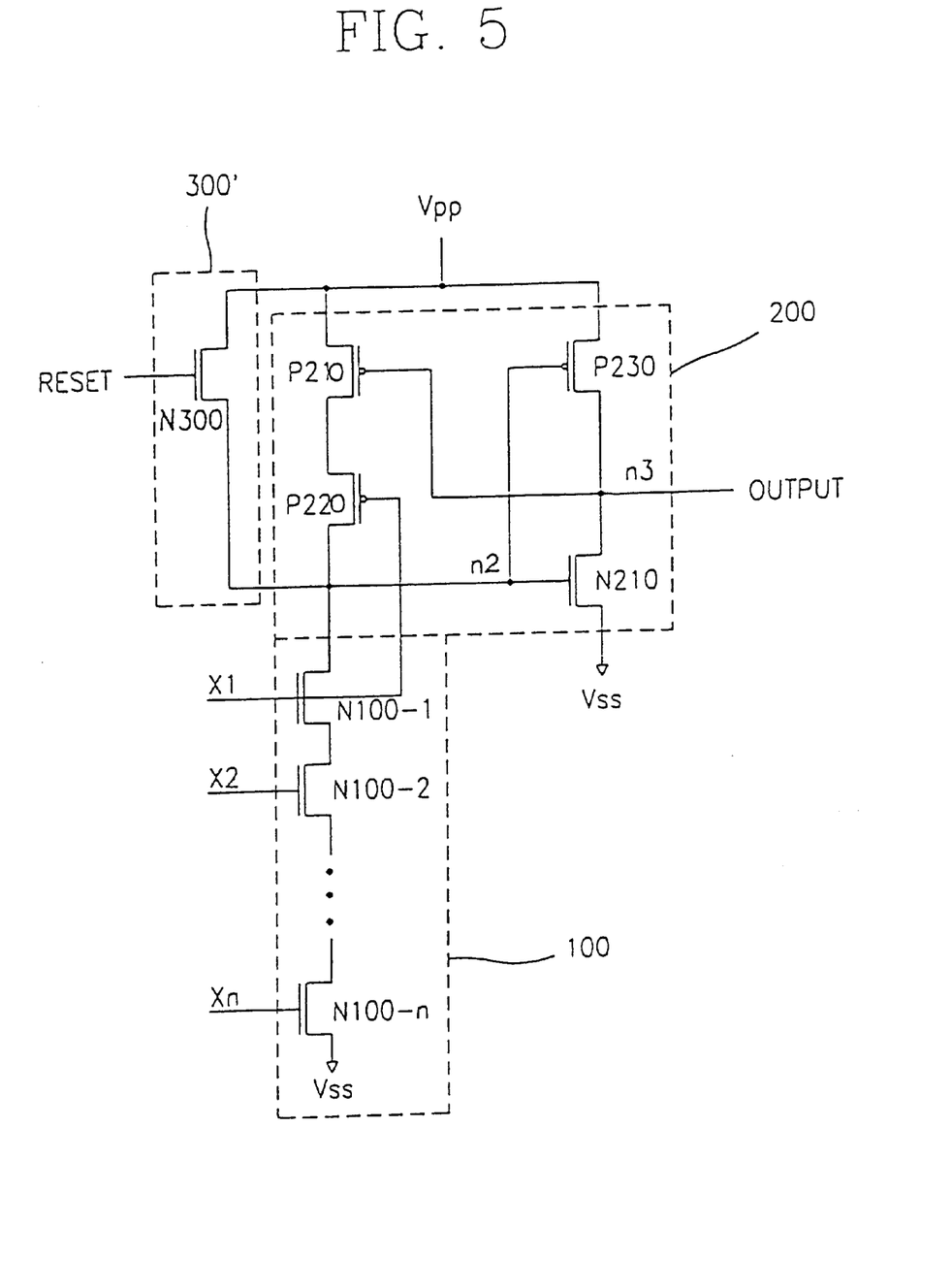
FIG. 5 is a circuit diagram illustrating a row decoder for a semiconductor memory device according to a fourth embodiment of the present invention.

In a fourth embodiment of the row decoder according to the present invention, as shown in FIG. 5, the decoding unit 100 and the reset latch unit 200 are configured identically to the corresponding units in the row decoder according to the first embodiment in FIG. 2.

The operation and effects of the row decoder according to the fourth embodiment of the present invention are similar to those of the row decoder according to the first embodiment in FIG. 2. In more detail, in the mode that the word line is not selected (namely, the reset signal RESET is a high level), the NMOS transistor N300 of the pre-charge unit 300' is turned on in accordance with the reset signal RESET outputted from the externally connected pre-decoding unit (not shown) and applied to the gate thereof. Therefore, the connection node n0 maintains a high level, and the output signal from the row decoder is stably maintained in a reset low level state. In the mode that the word line is selected (namely, the reset signal RESET is a low level), the NMOS transistor N300 is turned off, and thus the voltage charged on the node n0 is easily transited to a low level through the decoding unit 100.

The operation of the second PMOS transistor P220 for regulating the pull-up operation of the first PMOS transistor P210 of the reset latch unit 200 is the same as in the first embodiment in FIG. 2, and the operation and effects of the row decoder of the fourth embodiment are the same as for the row decoder of the first embodiment, so that description thereof will be omitted.

As described above, in the mode that the word line is not selected, the pull-up transistor is more effectively operated. The word line maintains a stable low state (reset state). In addition, in the mode that the word line is selected, the pull-up transistor is more effectively operated. Therefore, the pull-down operation is more easily performed, whereby the transition speed of the row decoder is increased, thus improving the access time. During the transition interval, it is possible to decrease an overlap current which flows through the pull-up and pull-down transistors. In the present invention, there is provided a pull-up limiting transistor, so that the operational capacity of the pull-down transistors is high and stable. Therefore, it is possible to reduce the size of the pull-down transistor, and it is possible to minimize the layout area of the semiconductor memory.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A row decoder, comprising:
    an internal node;
    an output node;
    a decoding unit receiving a plurality of externally-applied address signals and pulling-down the internal node to a logic low voltage when the plurality of address signals have an active state; and
    a latch unit pulling-up the output node to a logic high voltage in response to the pulling-down of the internal node to the logic low voltage by the decoding unit, pulling-down the output node to the logic low voltage when the internal node is at approximately the logic high voltage, and reducing a voltage at the internal node to a voltage less than the logic high level and greater than the logic low voltage based on a selection signal.

2. The row decoder according to claim 1, wherein the decoding unit comprises a plurality of NMOS transistors connected in series between the internal node and a ground voltage and receiving at their gates respective ones of the corresponding plurality of address signals.

3. The row decoder according to claim 1, wherein the latch unit comprises:
    a first PMOS transistor having its source connected to a boosted power supply voltage and its gate connected to the output node;
    a second PMOS transistor having its source connected to a drain of the first PMOS transistor, its drain connected to the internal node, and its gate receiving the selection signal; and
    a third PMOS transistor and a first NMOS transistor connected in series between the boosted power supply voltage and a ground voltage with their respective drains commonly connected to the output node and their respective gates commonly connected to the internal node.

4. The row decoder according to claim 1, wherein the latch unit comprises:

a first PMOS transistor having its source connected to a boosted power supply voltage and its gate for receiving the selection signal;

a second PMOS transistor having its source connected to a drain of the first PMOS transistor, its drain connected to the internal node, and its gate connected to the output node; and a third PMOS transistor and a first NMOS transistor connected in series between the boosted power supply voltage and a ground voltage with their respective drains commonly connected to the output node and their respective gates commonly connected to the internal node.

5. The row decoder according to claim 1, wherein the selection signal is a block selection signal.

6. The row decoder according to claim 1, wherein the address signals all have an active high state at a voltage less than a boosted power supply voltage for the row decoder.

7. The row decoder of claim 1, wherein the latch unit reduces the voltage at the internal node in response to the selection signal prior to the address signals achieving an active state.

8. The row decoder of claim 1, further comprising:

a precharge circuit pulling-up the internal node to approximately the logic high voltage in response to a precharge signal.

9. The row decoder of claim 1, wherein the logic high voltage is a boosted power supply voltage.

10. The row decoder of claim 1, further comprising:

a reset circuit causing the output node to attain the logic low voltage.

11. The row decoder according to claim 10, wherein the reset circuit comprises a MOS transistor connected between a boosted power supply voltage and the internal node, and said MOS transistor receiving a precharge signal at its gate.

12. The row decoder according to claim 11, wherein the MOS transistor is a PMOS transistor and the precharge signal has an active low state.

13. The row decoder according to claim 11, wherein the MOS transistor is an NMOS transistor and the precharge signal has an active high state at a voltage less than the boosted power supply voltage.

14. The row decoder of claim 1, wherein the selection signal is one of the address signals.

15. The row decoder of claim 14, wherein the latch unit reduces the voltage at the internal node when the address signal serving as the selection signal is in the active state.

* * * * *